US006862188B2

(12) United States Patent
Calhoon

(10) Patent No.: US 6,862,188 B2
(45) Date of Patent: Mar. 1, 2005

(54) COMPUTER WITH COVER REMOVAL DETECTION

(75) Inventor: John C. Calhoon, Woodinville, WA (US)

(73) Assignee: Microsoft Corporation, Redmond, WA (US)

(*) Notice: Subject to any disclaimer, the term of this patent is extended or adjusted under 35 U.S.C. 154(b) by 33 days.

(21) Appl. No.: 10/355,854

(22) Filed: Jan. 31, 2003

(65) Prior Publication Data

US 2004/0150958 A1 Aug. 5, 2004

(51) Int. Cl.$^7$ ................................................ H05K 5/00
(52) U.S. Cl. .................... 361/752; 340/571; 340/568.1; 340/555; 340/825.71
(58) Field of Search ............................ 361/724, 725, 361/752, 753, 760, 796, 797; 340/554, 555, 568.1, 571, 825.71, 825.31

(56) References Cited

U.S. PATENT DOCUMENTS

| | | | | |
|---|---|---|---|---|
| 5,229,749 A | * | 7/1993 | Yenglin | 340/568.8 |
| 5,760,690 A | * | 6/1998 | French | 340/571 |
| 5,825,626 A | * | 10/1998 | Hulick et al. | 361/724 |
| 5,912,621 A | * | 6/1999 | Schmidt | 340/571 |
| 6,191,503 B1 | * | 2/2001 | Kitten et al. | 307/112 |
| 6,388,574 B1 | * | 5/2002 | Davis et al. | 340/568.1 |

OTHER PUBLICATIONS

Elekon Industries, "Reflector Sensor", ERT–3102 (1 Page) retrieved from http://www.elekon.com/show products.asp-?cat=Reflective+Sensors on Apr. 9, 2004.

Elekon Industries, "Reflector Sensor", ERT–3270 (1 page) retrieved from http://www.elekon.com/show products.asp-?cat=Reflective+Sensors on Apr. 9, 2004.

Elekon Industries, "Reflector Sensor", ERT 3280 (2 pages) retrieved from http://www.elekon.com/show products.asp-?cat=Reflective+Sensors on Apr. 9, 2004.

Intel®SR2100 2U Rack Server Chassis, For Highly Reliable e–Business Solutions, Copyright 2001, retrieved from http://www.adstore.fr/download/SR2100.pdf.

MicroATX Electrical Design Suggestions, Version 1.0, pp. 1–24, Copyright 1998, http://www.formfactors.org/developer 5specsCATXELE1 1.pdf.

Super SMM1 System Management Module, User'Guide, Revision 1.0 Copyright 1997, 14 pp. retrieved from http://www2.Im–sensors.nu/~Im78/pdfs/smm 1.pdf.

PURCA User's Guide, Rio Works, The Reliable Building Block, Revision 1.0, Jul. 2002, 76 pp., retrieved from http://www.rioworks.com/Download/Manual/purca man-.pdf.

\* cited by examiner

Primary Examiner—David Martin
Assistant Examiner—Thanh S Phan
(74) Attorney, Agent, or Firm—Leydig, Voit & Mayer, Ltd.

(57) ABSTRACT

A computer uses an optical reflective optical sensor to detect the removal of a cover of the computer housing. The reflective optical sensor includes a light emitter and a light detector, and is mounted adjacent a reflective surface on the inner side of the cover when the cover is in place such that the light emitter is reflected by the reflective surface and received by the light detector. When the cover is removed, the intensity of the reflected light received by the light detector drops. The change in the output of the light detector triggers the operating system of the computer to power down the computer.

19 Claims, 3 Drawing Sheets

COMPUTER WITH COVER REMOVAL DETECTION

FIELD OF THE INVENTION

The present invention relates generally to computer hardware and, more particularly, to a feature incorporated into a computer system to prevent access to components inside the computer while the computer system is not powered off.

BACKGROUND OF THE INVENTION

Adding new hardware to or performing maintenance on a computer often requires accessing hardware components inside the housing of the computer. Typically, gaining access to the inside of the computer housing requires the removal of a cover, access panels, or lid of the housing. To protect the safety of the person working on the computer and to prevent the components in the computer from being damaged, it is important that the electrical power to the components be turned off when the cover is removed.

In many applications, however, a computer is not completely powered down even when it is not being used. For instance, a computer may implement a Sleep mode, such as the S3 state of the Advanced Configuration and Power Interface (ACPI) specification. In the sleep mode, the higher-level applications and peripheral devices of the computer system are not in operation, but the rest of the computer system remains on. To a user or service technician, the computer may appear to have been turned off. If the user or technician removes the cover and touches the components in the computer without completely powering off the computer, injury or device damage may occur, and the state data of the computer may be lost.

To prevent access to the internal components of a computer when the computer is still on, mechanical switches have traditionally been used for detecting the removal of the cover (or access panel or lid) of the computer housing. In such an application, the mechanical switch is pressed down by the cover when the cover is mounted in its normal closed position. Removing the cover causes the closing (or opening) of the switch contact, which triggers the computer operating system to shut down the computer.

The mechanical switches, however, are not satisfactory. The mechanical switches have to be accurately positioned and aligned to correctly register removal of the covers and, just as importantly, to avoid falsely registering removal when the covers are in fact in place. Moreover, they are subject to corrosion. Being mechanical devices, the switches are also subject to physical wear over repeated uses and may be damaged upon incorrect removal of the cover.

SUMMARY OF THE INVENTION

In view of the foregoing, the present invention provides a mechanism for detecting the removal of a cover from the case or housing of a computer system that makes use of a reflective optical sensor. As used hereinafter and in the claims, the term "cover" is used broadly to mean a cover, access panel, door, hatch, or lid, etc., that can be opened or removed from the computer housing to allow access to the internal components of the computer. The reflective optical sensor includes a light source and a light detector. The reflective optical sensor is positioned such that when the cover is in place the light emitted by the light source is reflected by a reflective surface on the inner side of the cover and received by the light detector. When the cover is removed while the computer is in a full-on or sleep state, removal of the cover causes the intensity of the light reflected by the cover to the light sensor to drop. As a result, the output of the light detector is changed. The change in the light detector output is used as a signal to trigger the operating system of the computer to start a shut down process. Because the reflective optical sensor uses light emitting and receiving devices, it has no mechanical parts that are susceptible to wear or damage from repeated use or corrosion over time.

DETAILED DESCRIPTION OF THE INVENTION

Figure 1:
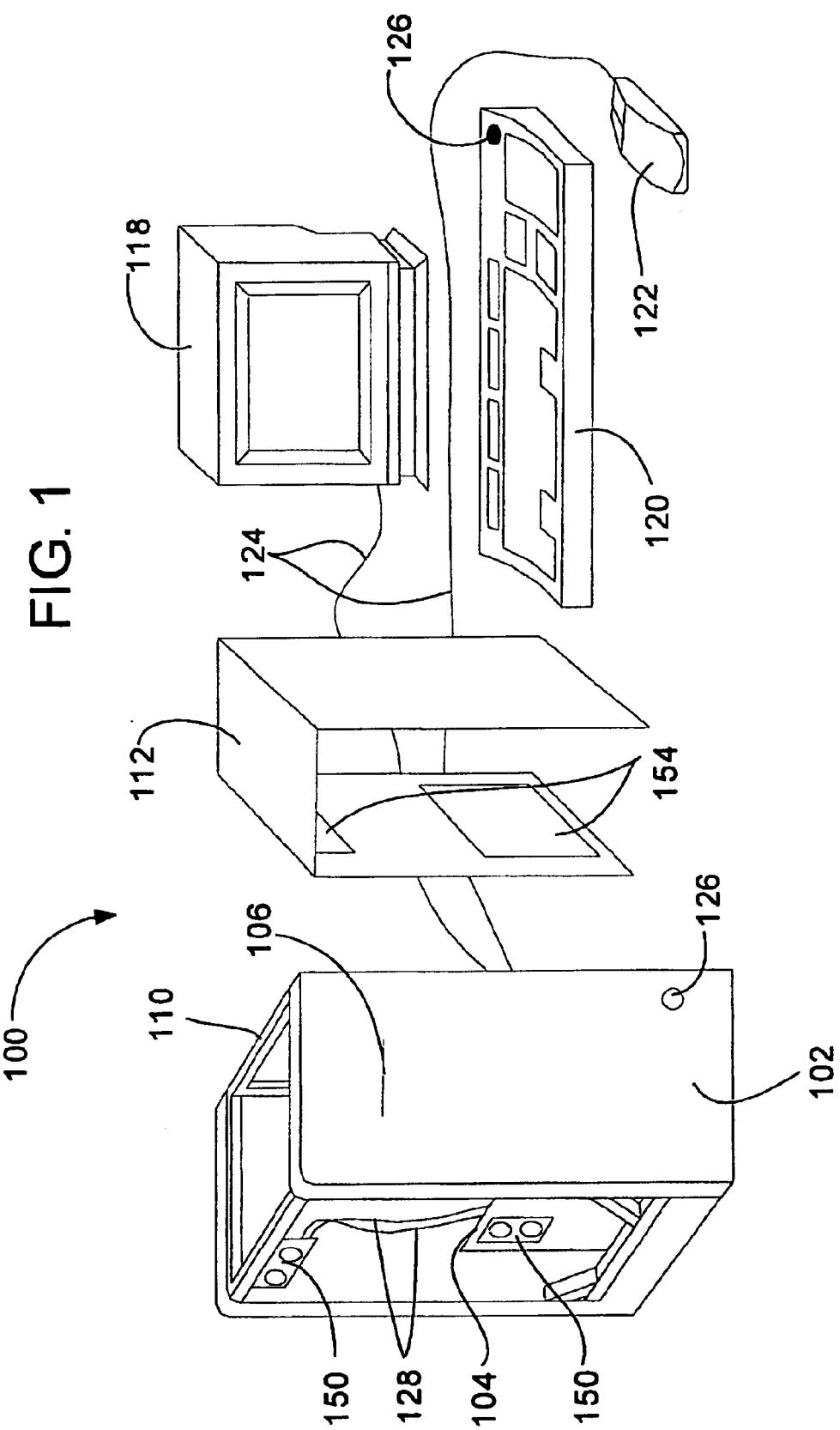
FIG. 1 is a perspective view of a computer system configured for implementing the present invention.

Now referring to the drawings, wherein like reference numerals refer to like elements, FIG. 1 shows an embodiment of a computer that implements the present invention. The computer includes a case or housing 102 that encloses many of the hardware components of the computer, such as the motherboard 104 and the disk drives 106. The case 102 is structured around a chassis 110 to which the various enclosed components can be mounted. To gain access to the enclosed components for maintenance and/or repair, the case 102 includes a removable cover or panel 112.

The computer 100 also includes various peripheral components that are not enclosed within the case 102. For example, the computer system may include output devices for interacting with users, such as a monitor 118 that can display a visual image. The computer system 100 may also include various input devices, such as a keyboard 120 and a mouse 122 that permit the inputting of information and data. The input and output devices can communicate with the components enclosed inside the case 102 by, for example, communication cables 124, such as a Universal Serial Bus (USB), or an infrared or radio frequency transceiver 126 for wireless communications.

Figure 2:
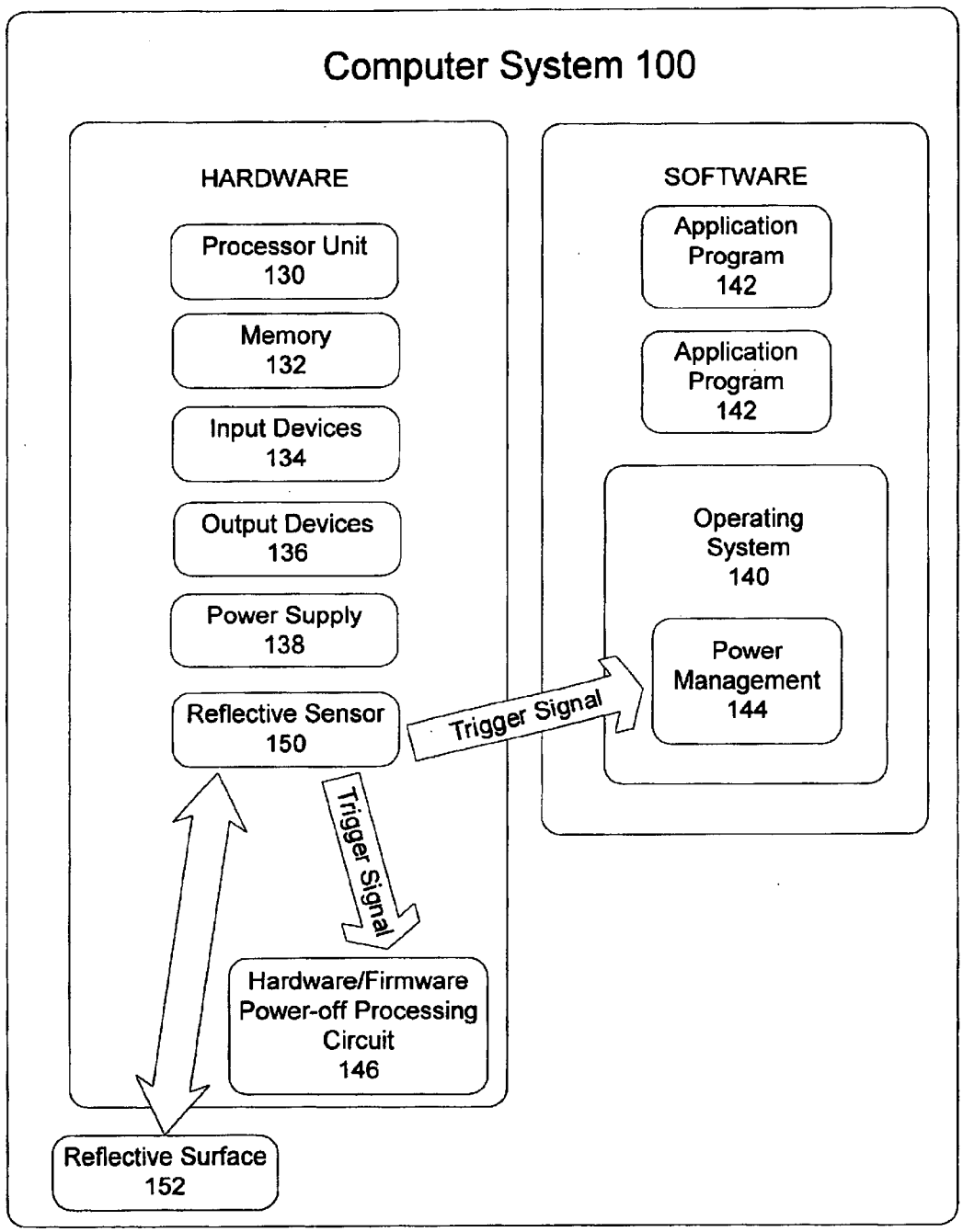
FIG. 2 is a block diagram illustrating the components of the computer system of FIG. 1.

The hardware and software components commonly included in a computer 100 are illustrated as functional blocks in FIG. 2. The computer 100 includes a processor unit 130 for executing instructions and a memory 132 for data storage, and input devices 134 and output devices 136. The power supply 138 converts utility-supplied power to a voltage usable by components of the computer system. The computer software typically comprises an operating system 140 and one or more application programs 142.

One of the many functions and subsystems of the operating system 140 is a power management module 144 that functions to conserve the energy required by the computer system by switching between a run mode and a sleep mode. The power management system 144 may switch the computer to the sleep mode when, for instance, the computer system 100 has not received any input from a user for a predetermined amount of time. Additionally, the user may explicitly selects to switch the computer to the sleep mode. In the sleep mode, the computer shuts down some of the higher-level applications and peripheral devices, however, power is still very much supplied to the critical hardware components such as the processor unit 130 and the memory 132, and state data may not have been saved.

Referring to FIGS. 1 and 2, because the computer system 100 may appear to be off when it is actually in a sleep mode, a user or technician servicing the computer may think the computer is off and may attempt to remove the cover 112 while the components are still operating under power. To prevent harm to the both the person and the computer 100, one or more reflective optical sensors 150 are incorporated into the computer housing to detect removal of the cover 112 from the case 110 while the computer system 100 is still under power. The reflective optical sensors 150 are interfaced with the operating system 140 to initiate a power-down operation. Interfacing the reflective optical sensors with the operating system can be accomplished by any suitable method known to those of skill in the art. In one implementation, the signal generated by a sensor 150 upon detection of the cover removal is received as a general-purpose event (GPE) by the operating system.

In some cases, the computer may be put into a "soft-off" state that corresponds to the S4 state of the ACPI specification. In that state, the operating system 140 has been unloaded from the random access memory of the computer, but some hardware portions of the computer system may still have power applied to them. Those hardware portions with power applied may still pose a risk of electrical shock and device damages if the cover of the computer is removed. To prevent such a risk, the power to the hardware portions is turned off in response to the trigger signal generated by the reflective optical sensor 150 when the cover is removed. Since the operating system 140 has been unloaded and thus cannot process the trigger signal, the trigger signal is processed by system hardware and/or firmware. To that end, as illustrated in FIG. 2, the reflective optical sensor 150 is also interfaced to a hardware/firmware power-off processing circuit 146. When the computer system 100 is in the soft-off state, if the power-off processing circuit 146 receives a trigger signal from the reflective optical sensor 150, it shuts off the power applied to the hardware portions of the computer.

Referring to FIG. 1, to monitor the presence of the cover 112, the reflective optical sensors 150 are located within the case 102 adjacent the cover. Each of the reflective optical sensors 150 includes a light emitter and a light detector. The sensor 150 is positioned such that the light generated by its light emitter is reflected by a reflective surface 154 on the inner side of the cover and received by its light detector. The reflective optical sensor may be mounted, for example, on a circuit board contained in the case 102. In one implementation, the reflective optical sensor is mounted on the motherboard 104. Alternatively, the reflective optical sensor may be mounted on the chassis 110. For those embodiments in which the reflective optical sensor 150 is mounted to the chassis, the interface with the operating system can occur via wires 128 connecting the reflective optical sensor to the appropriate locations on the motherboard 104.

Figure 3:
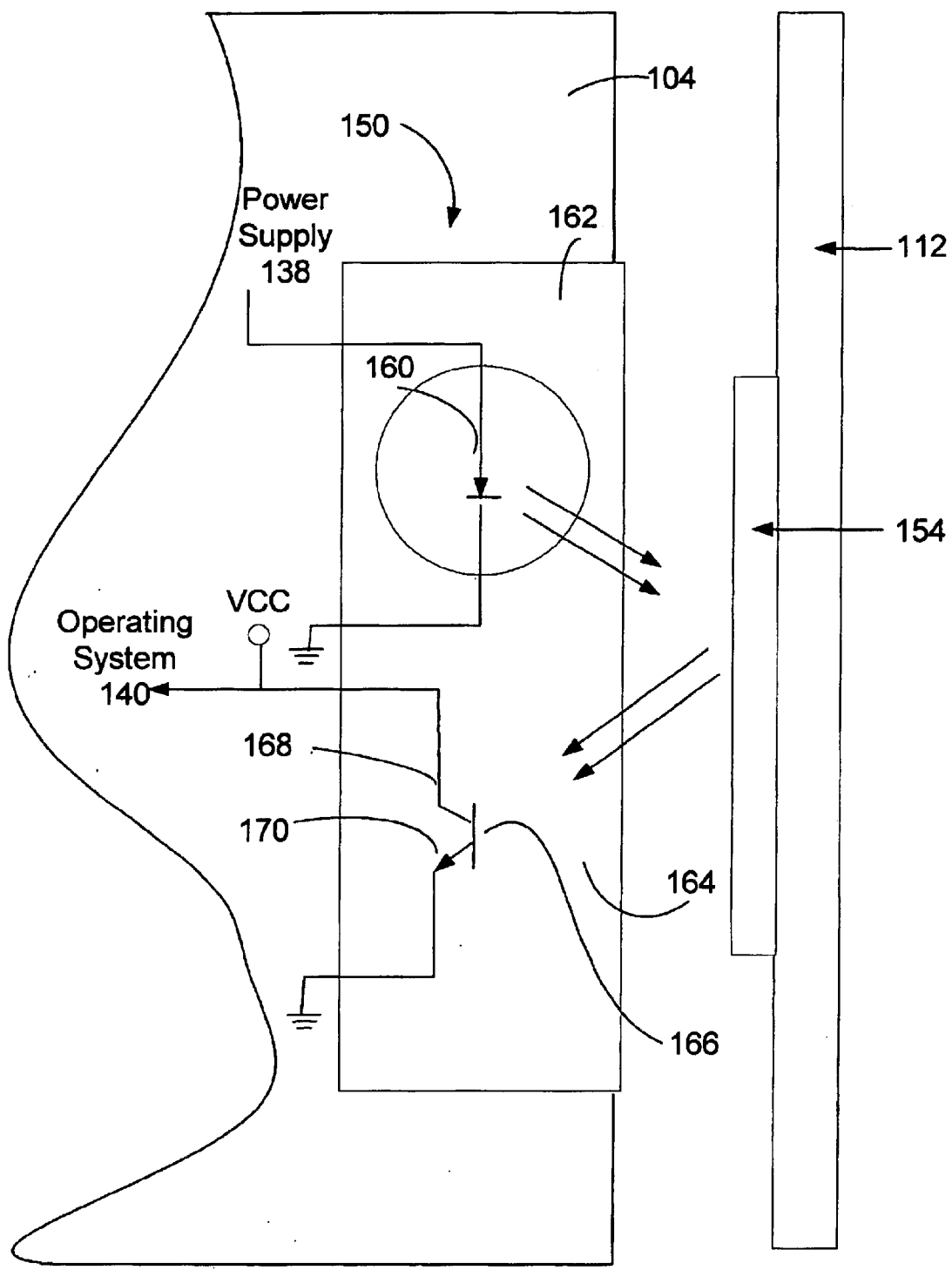
FIG. 3 is schematic diagram of a reflective optical sensor and a reflective panel.

In one implementation as illustrated in FIG. 3, the light source of the reflective optical sensor 150 is a light-emitting diode (LED) 160, and the light detector is a phototransistor 164. The LED 160 and the phototransistor 164 are both mounted on a supporting member 162. The phototransistor 164 is a light sensitive semiconductor device that schematically includes a photovoltaic base 166 that is located between a collector 168 and an emitter 170. When light strikes the photo-voltaic base 166, the base allows electric current to flow between the collector 168 and emitter 170 which can be interpreted by the operating system 140 as a signal. The power needed to operate the LED 160 and the phototransistor 164 is supplied from the power supply 138 of the computer system. Normally, when the cover is in place, the light from the LED 160 is reflected by the reflective surface of the cover onto the phototransistor 164. The phototransistor 164 is saturated by the light, and its output signal is a logical "0". Upon removal of the cover, the phototransistor 164 ceases to be saturated, and its output signal changes to a logical "1". This transition from "0" to "1" is a signal that the cover has been removed. In response, the system's power management circuitry and software completes an orderly power-down operation of the computer system. The power-down may include storing the state data of the system on the hard drive or another non-volatile memory.

Preferably, the power-down operation is carried out to completion soon enough after the removal of the cover is detected so that the user or technician will not have sufficient time to access the components in the case. In addition to performing the power-down operation, the computer may also generate an audio or visual alarm signal to indicate to the person that the computer system is still operating.

Referring to FIG. 1, to ensure that the reflective optical sensors 150 and the reflective surfaces 154 interact properly, each reflective surface should preferably be located in close proximity to and opposite of the respective reflective optical sensor. In an embodiment, the metallic material that often coats the interior of the cover 112 to control electromagnetic interference emissions can function as the reflective surface. In other embodiments, an additional piece of reflective material can be attached to the cover 112 to produce the reflective surface 154. Mylar tape with an adhesive backing is, for instance, a suitable reflective material for this purpose.

It should be noted that while the preceding embodiment has been described with the reflective optical sensor located inside the computer case and the reflective surface located on the cover, the arrangement of those components can be readily switched. Accordingly, embodiments of such alternative arrangements are contemplated.

It should be noted that in the foregoing description, the cover removal detection method has been describe as functioning while the computer system is in sleep mode. This is because it is during sleep mode that the cover will most likely be accessed inadvertently. However, it is not necessary that the cover removal detection method only functions during sleep mode. For instance, the detection of the cover removal when the computer is in the ON state can also cause the computer to power down.

Thus, there is provided a novel mechanism and method for optically detecting the removal of a cover from the case of a computer system. By using a reflective optical sensor, there are no mechanical parts that are subject to misalignment, wear, or corrosion.

In view of the many possible embodiments to which the principles of this invention may be applied, it should be recognized that the embodiments described herein with respect to the drawing figures are meant to be illustrative only and should not be taken as limiting the scope of the invention. Therefore, the invention as described herein contemplates all such embodiments as may come within the scope of the following claims and equivalents thereof.

I claim:

1. A computer comprising:
   a housing having a removable cover, the cover having a reflective surface on an inner side of the cover;
   components contained in the housing and accessible by removing the cover; and a reflective optical sensor disposed in the housing adjacent the reflective surface of the cover and interfaced to an operating system of the computer for detecting removal of the cover, the reflective optical sensor having a light emitter generating light directed to the reflective surface of the cover and a light detector disposed to receive light reflected by the reflective surface, the reflective optical sensor being connected to send a signal for triggering the operating system to initiate a power-down operation when removal of the cover is detected.

2. A computer as in claim 1, wherein the reflective optical sensor is mounted on a circuit board contained in the housing.

3. A computer as in claim 2, wherein the circuit board is a motherboard of the computer.

4. A computer as in claim 1, wherein the reflective optical sensor is mounted on a chassis of the computer inside the housing and connected to a motherboard of the computer.

5. A computer as in claim 1, wherein the light emitter is a light emitting diode (LED).

6. A computer as in claim 5, wherein the light detector is a phototransistor.

7. A computer as in claim 1, wherein the reflective surface is a reflective sheet adhered to the inner side of the cover.

8. A computer as in claim 1, further including a power-off processing circuit responsive to the signal from the reflective optical sensor to turn off power applied to hardware components of the computer when the computer is in a state in which the operating system of the computer has been unloaded.

9. A computer as in claim 1, further including an audio alert device, and wherein the operating system controls the audio alert device to generate an audio alert signal in response to receiving the signal from the reflective optical sensor.

10. A computer as in claim 1, further including an visual alert device, and wherein the operating system controls the visual alert device to generate a visual alert signal in response to receiving the signal from the reflective optical sensor.

11. A method of detecting removal of a removable cover on a housing of a computer, comprising:

directing light generated by a light emitter onto a reflective surface on an inner side of the cover;

monitoring an intensity of light generated by the light emitter and reflected from the reflective surface; and generating a signal for triggering the computer to power down when the intensity of light reflected from the reflective surface is reduced.

12. A method as in claim 11, further comprising the step of attaching a reflective sheet to the removable cover to provide the reflective surface.

13. A method as in claim 11, further comprising the step of generating an audio alarm signal.

14. A method as in claim 11, further comprising the step of generating a visual alert signal.

15. A computer comprising:

a housing having a removable cover;

components contained in the housing and accessible by removing the cover; and a reflective optical sensor disposed in the housing, the reflective optical sensor having a light emitter generating light directed to an inner surface of the cover and a light detector disposed to receive light reflected by the inner surface and interfaced to an operating system of the computer for detecting removal of the cover, the reflective optical sensor being connected to send a signal for triggering the operating system to initiate a power-down operation when removal of the cover is detected.

16. A computer as in claim 15, wherein the inner surface of the cover includes a reflective sheet disposed to reflect light from the light emitter to the light detector.

17. A computer as in claim 15, wherein optical sensing means is mounted on a motherboard contained in the housing.

18. A computer as in claim 15, wherein the optical sensing means is mounted on a chassis of the computer inside the housing and connected to a motherboard of the computer.

19. A computer as in claim 15, further including a power-off processing circuit responsive to the signal from the optical sensing means to turn off power applied to hardware components of the computer when the computer is in a state in which the operating system of the computer has been unloaded.

* * * * *